United States Patent
Kokubun et al.

[11] Patent Number: 6,075,477
[45] Date of Patent: Jun. 13, 2000

[54] VOLTAGE SELECTOR FOR A D/A CONVERTER

[75] Inventors: Masatoshi Kokubun; Shinya Udo, both of Kasugai, Japan

[73] Assignee: Fujitsu Limited, Kawasaki, Japan

[21] Appl. No.: 09/122,646

[22] Filed: Jul. 27, 1998

[30] Foreign Application Priority Data

Feb. 27, 1998 [JP] Japan .................................. 10-047680

[51] Int. Cl.$^7$ .................................................. H03M 1/78
[52] U.S. Cl. .......................................... 341/154; 341/118
[58] Field of Search .................................. 341/144, 154, 341/148, 150, 153

[56] References Cited

U.S. PATENT DOCUMENTS

| | | | |
|---|---|---|---|
| 4,800,365 | 1/1989 | White et al. | 341/154 |
| 5,065,159 | 11/1991 | Kuwana | 341/148 |
| 5,424,740 | 6/1995 | Chang et al. | 341/154 |
| 5,708,434 | 1/1998 | Hasegawa | 341/148 |

*Primary Examiner*—Michael Tokar
*Assistant Examiner*—Peguy JeanPierre
*Attorney, Agent, or Firm*—Armstrong, Westerman, Hattori, McLeland & Naughton

[57] ABSTRACT

A voltage selector for a D/A converter compensates for varying output response times for different value input signals due to variations in signal line lengths. The voltage selector includes a plurality of first stage transfer gates, including first and second groups of transfer gates, and a plurality of second stage transfer gates, including a first transfer gate connected to the first group of transfer gates and a second transfer gate connected to the second group of transfer gates. The number of the first group of transfer gates is greater than the number of the second group of transfer gates and the number of the second group of transfer gates is set such that a load of the second transfer gate is smaller than a load of the first transfer gate.

6 Claims, 11 Drawing Sheets ered via a node N20 to the input terminal of the switch
VOLTAGE SELECTOR FOR A D/A CONVERTER

BACKGROUND OF THE INVENTION

The present invention relates generally to a voltage selector, and, more particularly, to a voltage selector suitable for use in a D/A converter.

DESCRIPTION OF THE RELATED ART

FIG. 1 is a schematic block diagram of a conventional D/A converter 100. The D/A converter 100 has a voltage generator 51, a voltage selector 53 and a decoder 54, all formed on a single semiconductor substrate.

The voltage generator 51 includes a ladder resistor having fifteen resistors R connected in series, with supply voltages $V_{DD}$ and $V_{SS}$ respectively supplied to the ends of the ladder resistor. Voltages V1 to V16 are output from nodes N1 to N16 located between the individual resistors R. The voltages V1 to V16 are generated by dividing the potential difference between the supply voltages $V_{DD}$ and $V_{SS}$ by sixteen.

The voltage selector 53 includes sixteen switches SW1-1 to SW1-16 at a first stage respectively connected to the nodes N1 to N16, and four switches SW2-1 to SW2-4 at a second stage each connected to a group of four switches at the first stage. Each of the switches SW1-1 to SW1-16 and SW2-1 to SW2-4 comprises an MOS transistor.

Specifically, the output terminals of the first group of switches SW1-1 to SW1-4 are connected to the input terminal of the switch SW2-1 via a node N17. The output terminals of the second group of switches SW1-5 to SW1-8 are connected via a node N18 to the input terminal of the switch SW2-2. The output terminals of the third group of switches SW1-9 to SW1-12 are connected via a node N19 to the input terminal of the switch SW2-3. The output terminals of the fourth group of switches SW1-13 to SW1-16 are connected via a node N20 to the input terminal of the switch SW2-4. The output terminals of the switches SW2-1 to SW2-4 of the second stage are connected via a node N21 to an output terminal 55 of the D/A converter 100.

The decoder 54 receives a 4-bit digital signal D3 to D0 input from an external circuit (not shown), sends a first control signal (select signal) based on the digital signals D1 and D0 of the lower two bits to the switches SW1-1 to SW1-16 of the first stage and sends a second control signal (select signal) based on the digital signals D3 and D2 of the higher two bits to the switches SW2-1 to SW2-4 of the second stage. Any one of the first group of switches SW1-1 to SW1-4, the second group of switches SW1-5 to SW1-8, the third group of switches SW1-9 to SW1-12 and the fourth group of switches SW1-13 to SW1-16 is turned on in response to the first control signal. Any one of the switches SW2-1 to SW2-4 is turned on in response to the second control signal. Consequently, the output terminal 55 is connected to one of the nodes N1–N16 via the enabled one of the switches of the first and second stages, and the voltage of the connected node, one of N1–N16, appears at the node N21. Accordingly, the D/A converter 100 sends out an analog signal Aout having a voltage corresponding to the digital signals D3–D0 from the output terminal 55.

The voltage selector 53 with two stages of switches has a smaller parasitic capacitance (drain capacitance) of the entire wiring to the output terminal than a voltage selector with a single stage of switches. This shortens the time from the point of a change in the digital signals D3–D0 to the point of outputting the analog signal Aout having a voltage corresponding to the changed digital signals (i.e,. the output response time of the D/A converter). The restriction on the layout of the voltage selector 53 however results in different lengths of lines which connect the nodes N1–N16 to the node N21. The different line lengths results in different values of parasitic elements present between the nodes N1–N16 and the node N21 or causes the lines connecting the nodes N1–N16 to the node N21 to have different capacitances and resistances. As a result, the output response time of the D/A converter varies with the value of the output signal.

Accordingly, it is an objective of the present invention to provide a voltage selector with less variation in output response time.

SUMMARY OF THE INVENTION

Briefly stated, the present invention provides a voltage selector that includes a plurality of first stage transfer gates, including first and second groups of transfer gates, and a plurality of second stage transfer gates, including a first transfer gate connected to the first group of transfer gates and a second transfer gate connected to the second group of transfer gates. One of the first stage transfer gates transfers an input signal in response to a first select signal, and one of the second stage transfer gates receives and transfers an input signal, transferred from an associated one of the first stage transfer gates, in response to a second select signal. The number of the first group of transfer gates is greater than the number of the second group of transfer gates, and the number of the second group of transfer gates is set such that a load of the second transfer gate is smaller than a load of the first transfer gate.

The present invention further provides a D/A converter that includes a voltage generator for dividing a voltage of a reference voltage supply and generating a plurality of divided voltages, and a decoder for decoding a digital signal and generating first and second select signals. A plurality of first stage transfer gates is provided in accordance with the plurality of divided voltages and includes first and second groups of transfer gates. One of the first stage transfer gates receives an associated divided voltage from the voltage generator and outputs the divided voltage in response to the first select signal. A plurality of second stage transfer gates includes a first transfer gate connected to the first group of transfer gates and a second transfer gate connected to the second group of transfer gates. One of the second stage transfer gates receives and outputs the divided voltage, transferred from an associated one of the first stage transfer gates, in response to the second select signal. The number of the first group of transfer gates is grater than the number of the second group of transfer gates, and the number of the second group of transfer gates is set such that a load of the second transfer gate is smaller than a load of the first transfer gate.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
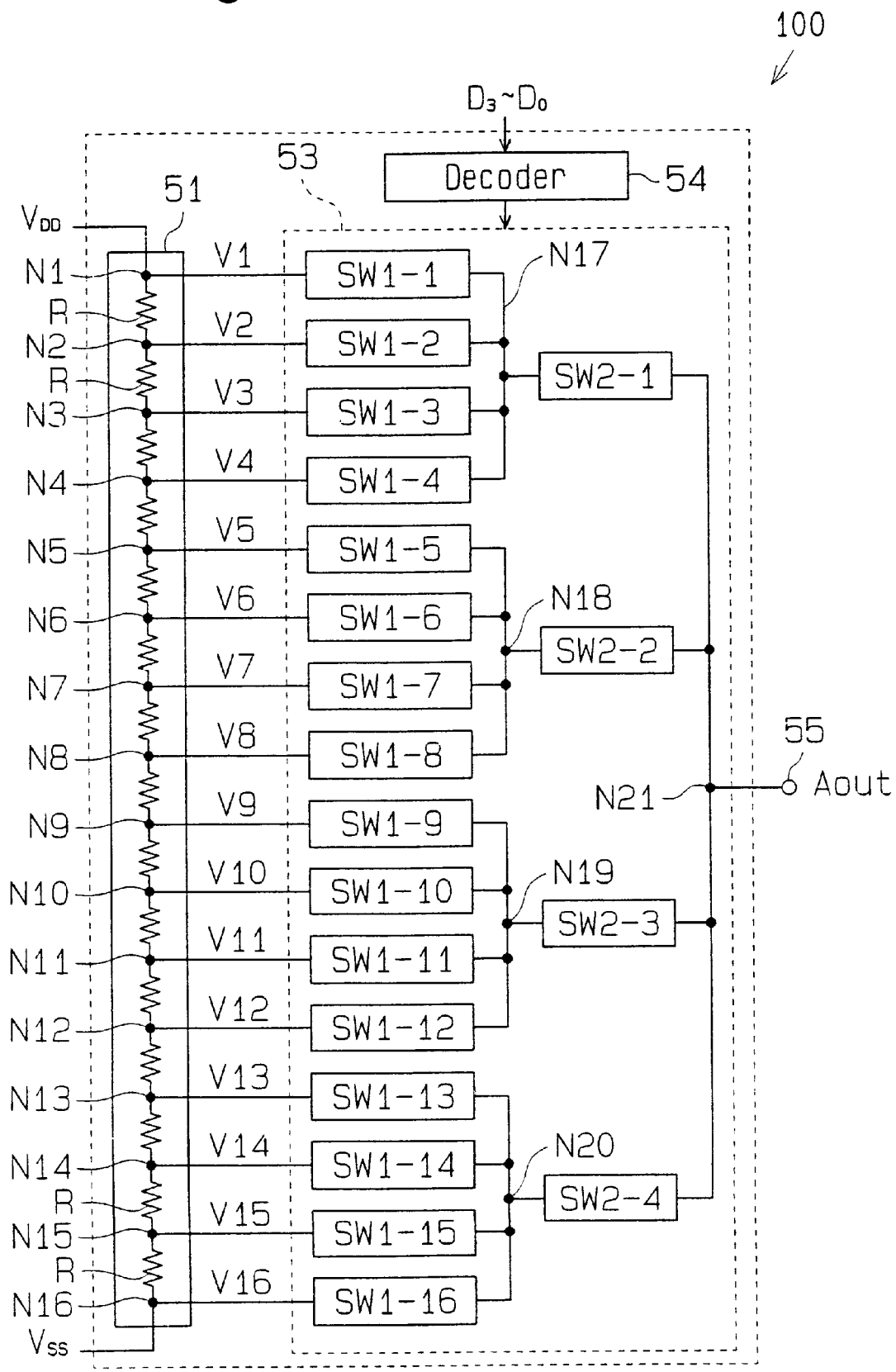
FIG. 1 is a schematic block circuit diagram of a conventional D/A converter.
Figure 2:
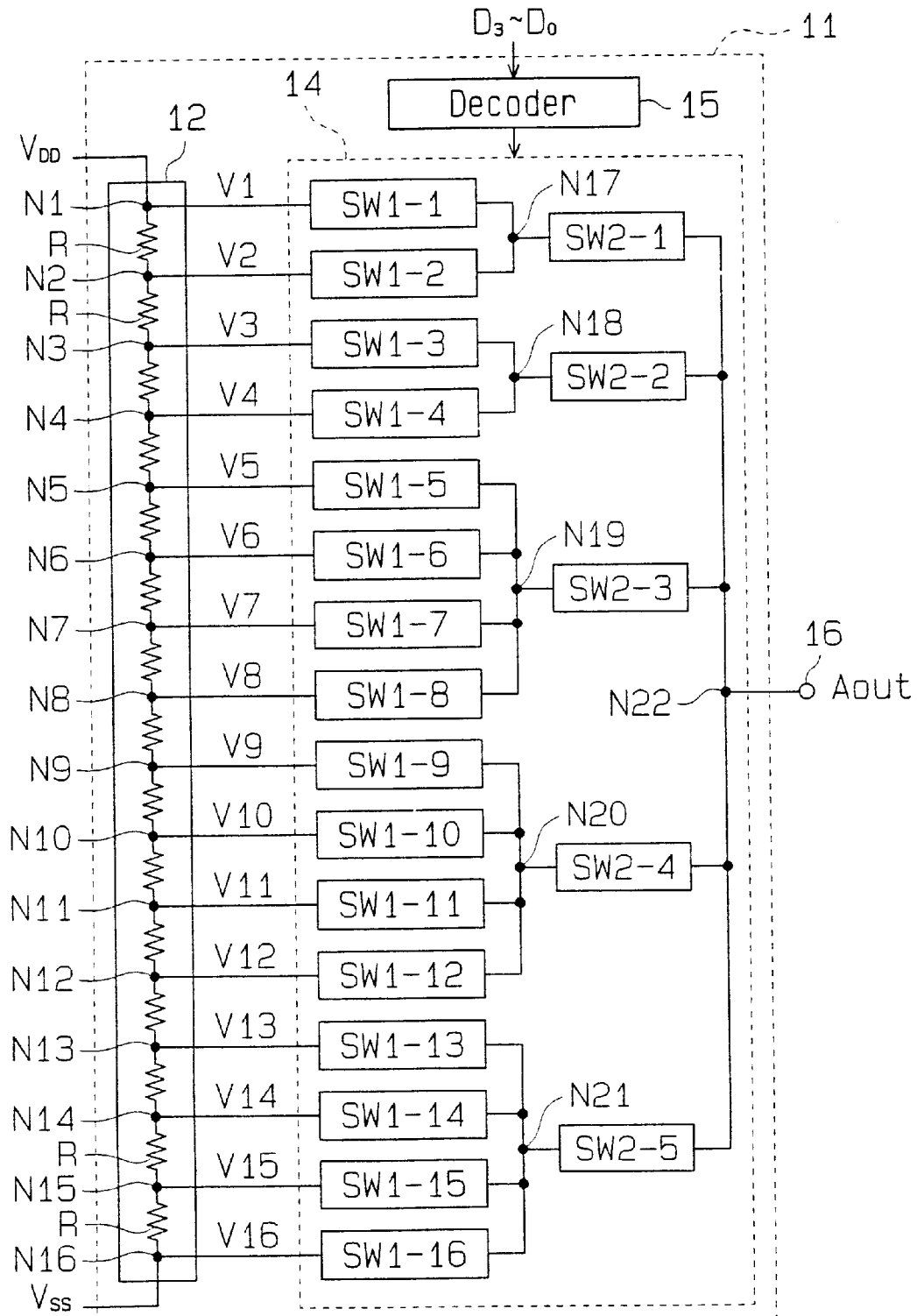
FIG. 2 is a schematic block circuit diagram of a D/A converter according to a first embodiment of the present invention.

FIG. 2 is a schematic block circuit diagram of a D/A converter 11 according to a first embodiment of the present invention. The D/A converter 11 includes a voltage generator 12, a voltage selector 14 and a decoder 15, formed on a single semiconductor substrate. The voltage generator 12 includes a ladder resistor having fifteen resistors R connected in series, with the voltages of a high-potential voltage supply $V_{DD}$ and a low-potential voltage supply $V_{SS}$ supplied to opposing ends of the ladder resistor. Voltages V1 to V16 are output from nodes N1 to N16 located between the individual resistors R. The voltages V1 to V16 are generated by dividing the voltage difference ($V_{DD}$–$V_{SS}$) between the high-potential voltage supply $V_{DD}$ and the low-potential voltage supply $V_{SS}$ by sixteen.

The voltage selector 14 includes sixteen switches SW1-1 to SW1-16 of the first stage respectively connected to the nodes N1 to N16, and five switches SW2-1 to SW2-5 of the second stage connected to the switches SW1-1 to SW1-16 of the first stage. Each of the switches SW1-1 to SW1-16 and SW2-1 to SW2-5 comprises an MOS transistor, and operates as a transfer gate.

Specifically, the output terminals of the first group of switches SW1-1 and SW1-2 are connected to the input terminal of the switch SW2-1 via a node N17. The output terminals of the second group of switches SW1-3 and SW1-4 are connected via a node N18 to the input terminal of the switch SW2-2. The output terminals of the third group of switches SW1-5 to SW1-8 are connected via a node N19 to the input terminal of the switch SW2-3. The output terminals of the fourth group of switches SW1-9 to SW1-12 are connected via a node N20 to the input terminal of the switch SW2-4. The output terminals of the fifth group of switches SW1-13 to SW1-16 are connected to the input terminal of the switch SW2-5 via a node N21.

The output terminals of the switches SW2-1 to SW2-5 of the second stage are connected via a node N22 to an output terminal 16 of the D/A converter 11. The D/A converter 11 sends out an analog signal Aout having the voltage at the node N22 from the output terminal 16.

Figure 3:
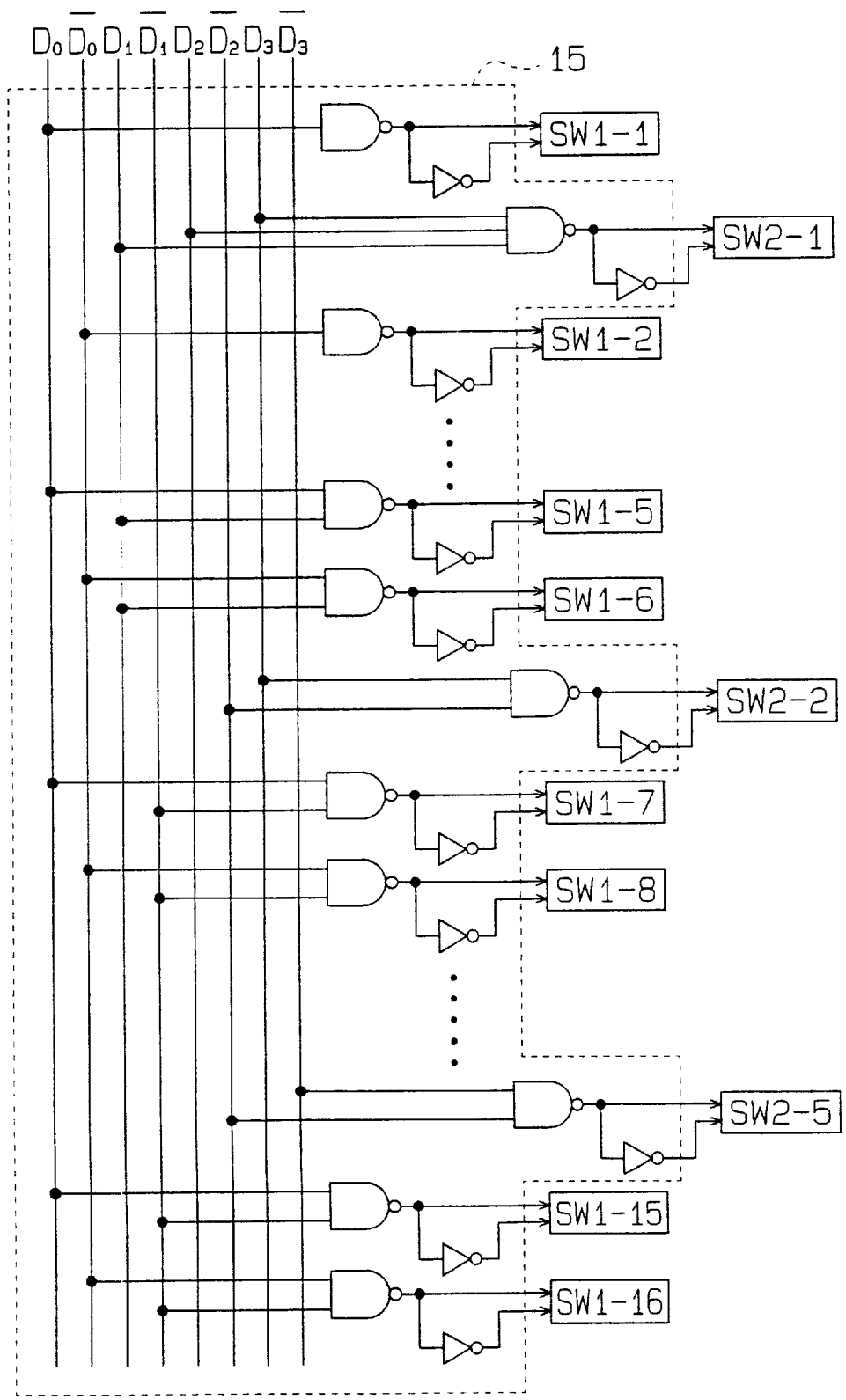
FIG. 3 is a circuit diagram of a decoder of the D/A converter in FIG. 2.

As shown in FIG. 3, the decoder 15 receives a 4-bit digital signal D3 to D0 input from an external circuit (not shown), and generates a first control signal to enable one of the first group of switches SW1-1 and SW1-2 and the second group of switches SW1-3 and SW1-4, in accordance with a lower one bit of the digital signal. The decoder 15 generates a second control signal to enable one of the switches SW2-1 and SW2-2 of the second stage in accordance with the upper three bits of the digital signals. The decoder 15 generates a third control signal to enable one of the third group of switches SW1-5 to SW1-8, the fourth group of switches SW1-9 to SW1-12 and the fifth group of switches SW1-13 to SW1-16 in accordance with the lower two bits of the digital signals. The decoder 15 further generates a fourth control signal to enable one of the switches SW2-3 to SW2-5 of the second stage in accordance with the upper two bits of the digital signals. As apparent from the above, the decoder 15 enables one of the switches of the first stage and enables one of the switches SW2-1 to SW2-5 of the second stage in accordance with the digital signal. Consequently, the node N22 is connected to one of the nodes N1–N16 and one of the voltages V1–V16 is output at the output terminal 16 as an output voltage Aout.

The operation of the D/A converter 11 will be discussed below. It is assumed that due to layout restrictions, the length of a first line between each of the nodes N1–N4 and the output terminal 16 is longer than the length of a second line between each of the nodes N5–N16 and the output terminal 16. Thus, the value of a parasitic element (i.e., a parasitic resistance and parasitic capacitance) of the first line is greater than the value of a parasitic element of the second line. According to this embodiment, the number of the switches of the first stage which are connected to the switches of the second stage is set such that the drain capacitance of the switch with the output terminal 16 taken as a reference varies in accordance with the length of the line thereto. The drain capacitance with the output terminal 16 taken as a reference changes when one of the switches SW2-1 to SW2-5 of the second stage is enabled.

Specifically, two switches SW1-1 and SW1-2 of the first stage are connected to the switch SW2-1 of the second stage present in the path having the long line, and two switches SW1-3 and SW1-4 of the first stage are connected to the switch SW2-2 of the second stage also present in the path of the long line. By contrast, four switches SW1-5 to SW1-8, four switches SW1-9 to SW1-12 and four switches SW1-13 to SW1-16, all of the first stage, are respectively connected to the switches SW2-3, SW2-4 and SW2-5 of the second stage which exist in the path having the short line.

When the switch SW2-1 of the second stage is enabled, for example, the drain capacitances of the switches SW1-1 and SW1-2 of the first stage connected to that switch SW2-1 are added to the drain capacitance with the output terminal 16 taken as a reference. Likewise, when the switch SW2-2 of the second stage is enabled, the drain capacitances of the switches SW1-3 and SW1-4 of the first stage connected to that switch SW2-2 are added to the drain capacitance with the output terminal 16 taken as a reference.

When the switch SW2-3 of the second stage is enabled, by contrast, the drain capacitances of the four switches SW1-5 to SW1-8 connected to that switch SW2-3 are added to the drain capacitance with the output terminal 16 taken as a reference. When the switch SW2-4 of the second stage is enabled, the drain capacitances of the four switches SW1-9 to SW1-12 connected to that switch SW2-4 are added to the drain capacitance with the output terminal 16 taken as a reference. Likewise, when the switch SW2-5 of the second stage is enabled, the drain capacitances of the four switches SW1-13 to SW1-16 connected to that switch SW2-5 are added to the drain capacitance with the output terminal 16 taken as a reference.

Therefore, the drain capacitance when the switch SW2-1 or SW2-2 of the second stage provided in the long line path is enabled is smaller than the drain capacitance when the switch SW2-3, SW2-4 or SW2-5 of the second stage is enabled. The smaller the drain capacitance becomes, the shorter the output response time of the D/A converter becomes. As the drain capacitance with the output terminal 16 taken as a reference in the long line path becomes smaller, the difference between the output time of the analog signal Aout output via the first group of switches SW1-1 and SW1-2 or the second group of switches SW1-3 and SW1-4 and the output time of the analog signal Aout output via the third group of switches SW1-5 to SW1-8, the fourth group of switches SW1-9 to SW1-12 or the fifth group of switches SW1-13 to SW1-16 becomes smaller. This results in a faster output response time of the D/A converter 11.

A description will now be given of a case where the lengths of the lines between the nodes N1–N16 and the output terminal 16 are substantially the same. In this case, the values of the parasitic elements of the lines between the nodes N1–N16 and the output terminal 16 are substantially equal to one another. Therefore, the output response times for the lines between the nodes N1–N16 and the output terminal 16 are substantially equal to one another.

Two switches SW1-1 and SW1-2 of the first stage and one switch SW2-1 of the second stage are connected between the nodes N1 and N2 and the output terminal 16, and two switches SW1-3 and SW1-4 of the first stage and one switch SW2-2 of the second stage are connected between the nodes N3 and N4 and the output terminal 16. This makes the load on each of the switches SW2-1 and SW2-2 of the second stage smaller than the load on each of the other second stage switches SW2-3 to SW2-5. As a result, the output response time of the analog signal Aout having the voltage at one of the nodes N1–N4 becomes shorter than the output response time of the analog signal Aout having the voltage at one of the other nodes N5–N16. This quickens the output time for the analog signal Aout of the D/A converter 11 which has a specific voltage.

It should be apparent to those skilled in the art that the present invention may be embodied in many other specific forms without departing from the spirit or scope of the invention. Particularly, it should be understood that the invention may be embodied in the following forms.

Figure 4:
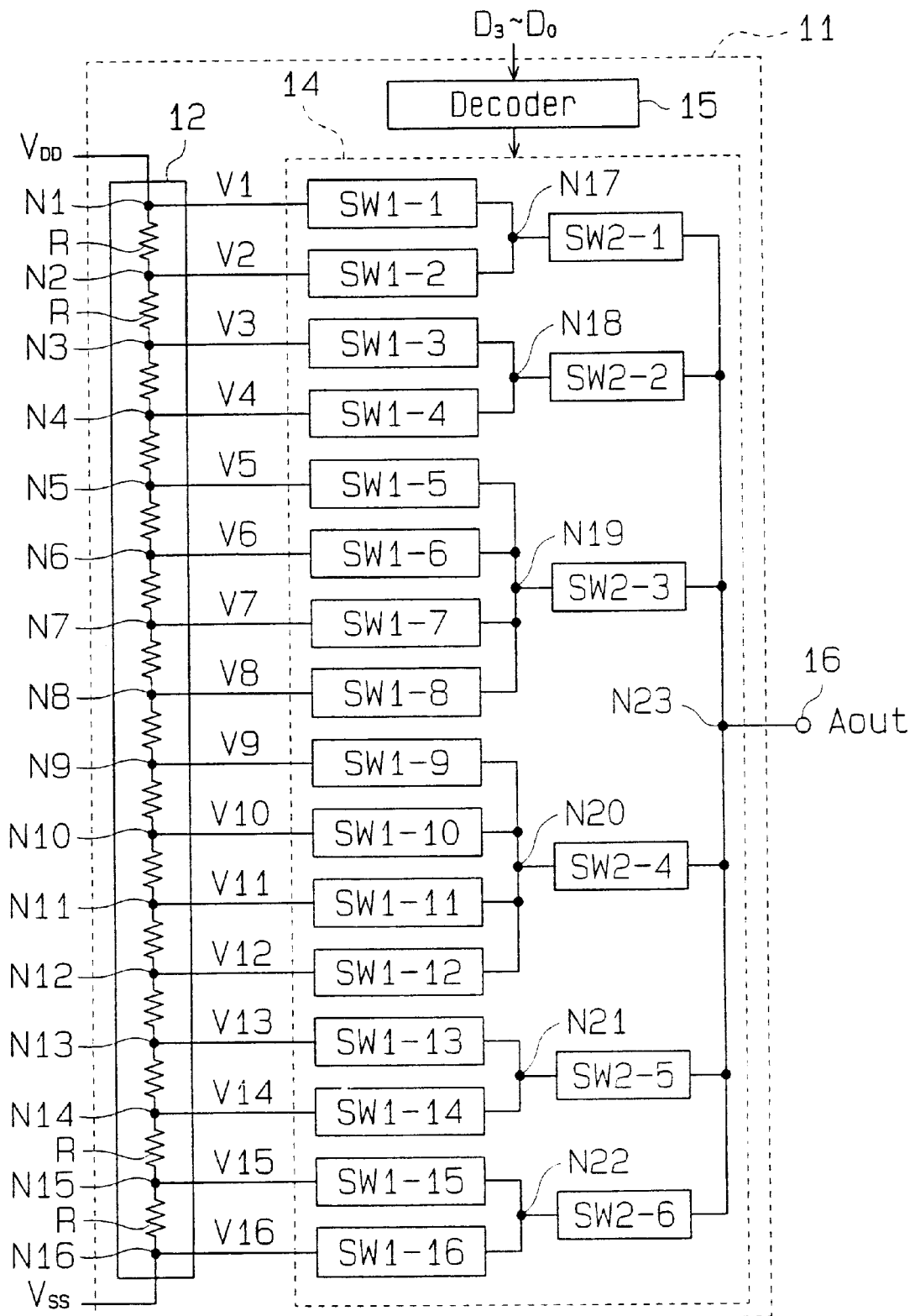
FIG. 4 is a schematic block circuit diagram of a D/A converter according to a second embodiment of the present invention.

To reduce the drain capacitance with the output terminal 16 taken as a reference, the number of switches of the first stage connected to the switches of the second stage may be decreased further. For example, in the case where the response time of the switches SW1-13 to SW1-16 is long, a structure as shown in FIG. 4 can be changed to decrease the output response time of the D/A converter. In FIG. 4, a switch SW2-5 of the second stage connected to the switches SW1-13 and SW1-14 of the first stage and a switch SW2-6 of the second stage connected to the switches SW1-15 and SW1-16 of the first stage is provided. This structure reduces the drain capacitance with the output terminal 16 taken as a reference, thus shortening the output response time of the individual switches.

Figure 5:
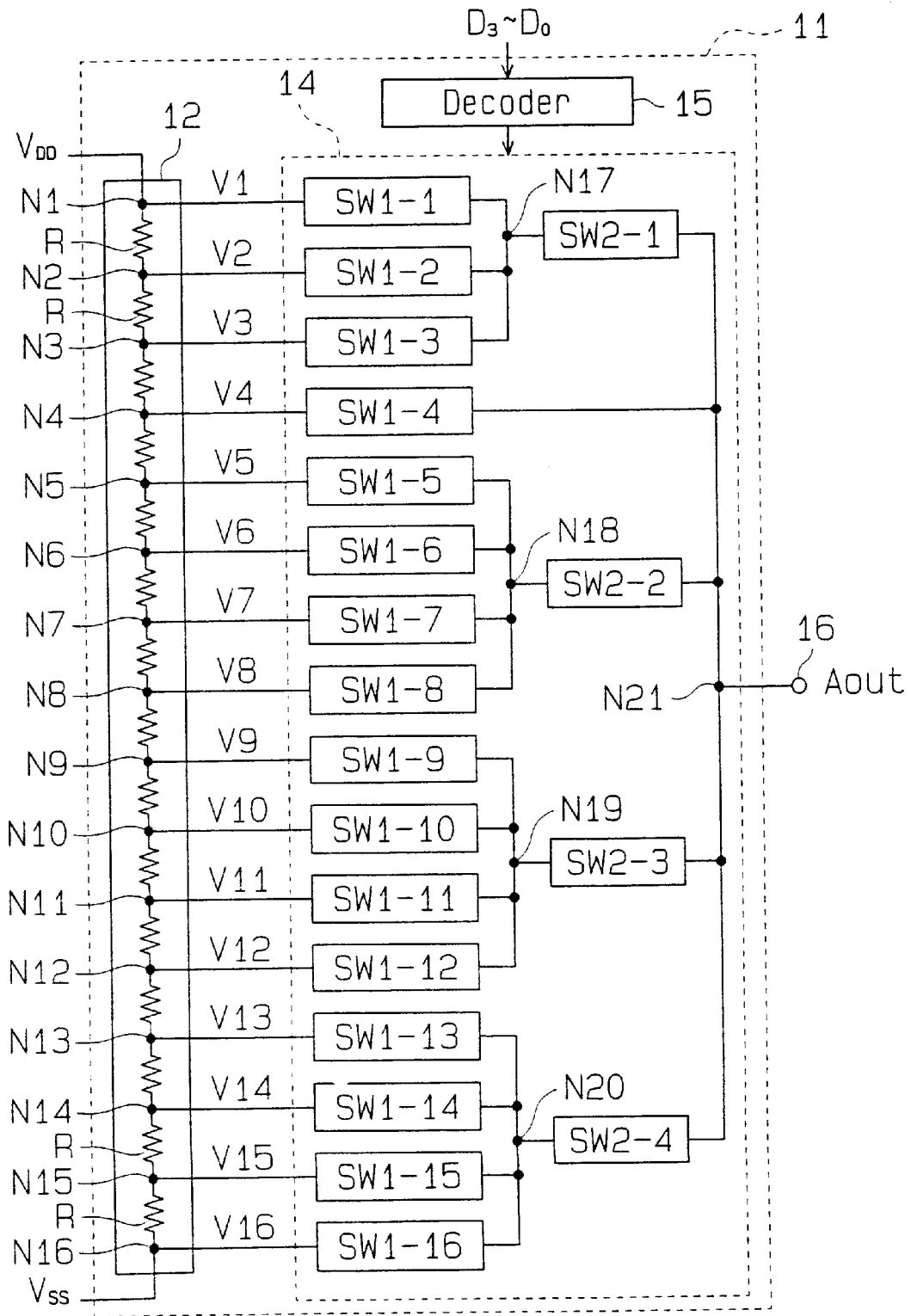
FIG. 5 is a schematic block circuit diagram of a D/A converter according to a third embodiment of the present invention.

The switches of the first stage that are provided in paths of a longer line length than the other switches of the first stage in paths of a shorter line length may be connected directly to the output terminal 16. As shown in FIG. 5, for example, the switch SW1-4 of the first stage connected to the node N4 is connected directly to the output terminal 16. This reduces the drain capacitance with the output terminal 16 taken as a reference when the switch SW1-4 is enabled. Therefore, the output time for the analog signal Aout having the voltage V4 at the node N4 approaches the output times for the analog signals Aout having the other voltages V1–V3 and V5–V16, thus reducing the response time originating from a difference in length between the individual lines.

Figure 6:
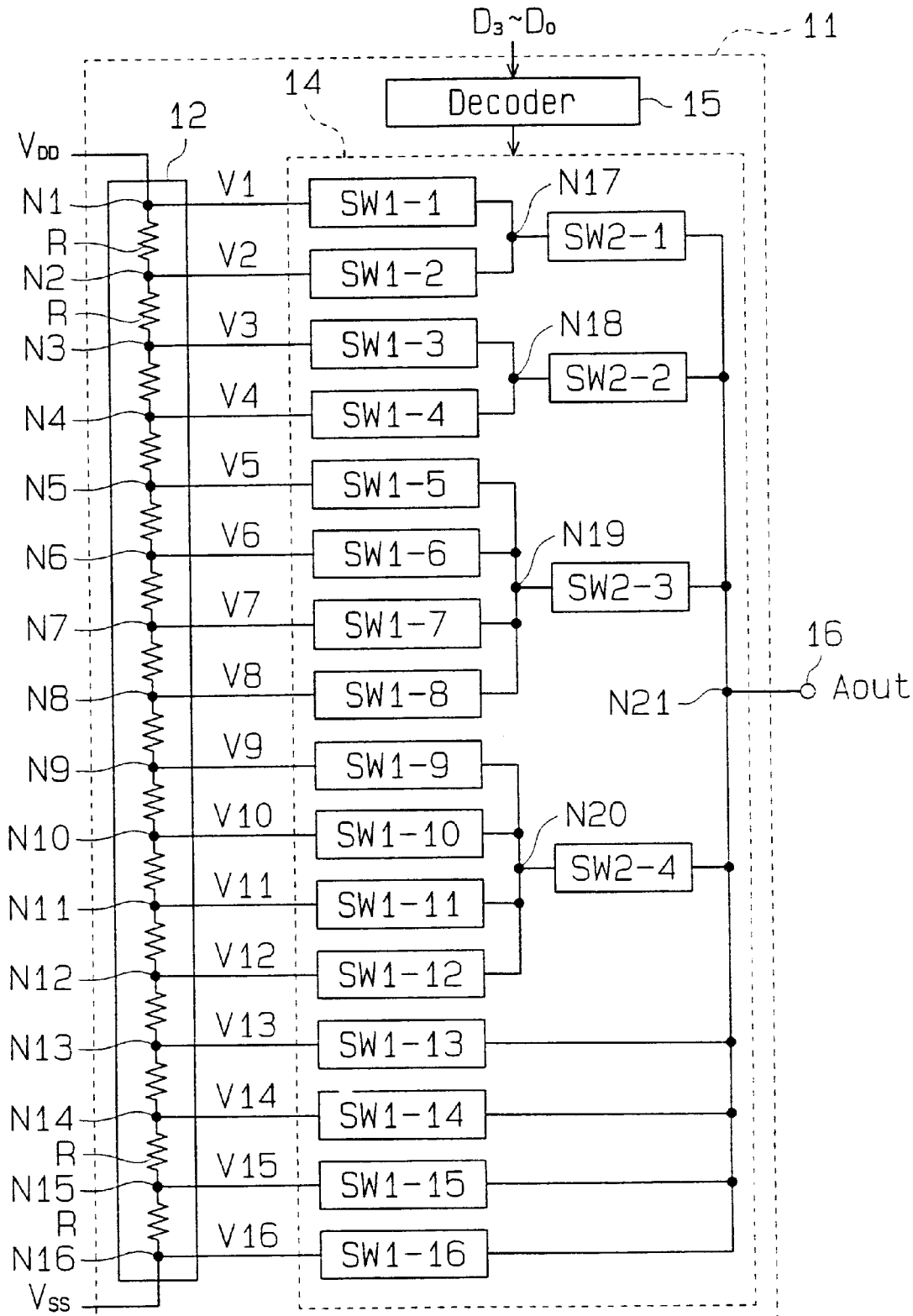
FIG. 6 is a schematic block circuit diagram of a D/A converter according to a fourth embodiment of the present invention.

The connection shown in FIG. 2 or FIG. 4 may be combined with the connection shown in FIG. 5. Specifically, as shown in FIG. 6, the switch SW2-1 of the second stage is connected to the switches SW1-1 and SW1-2 of the first stage, and the switch SW2-2 of the second stage is connected to the switches SW1-3 and SW1-4 of the first stage. Further, the switches SW1-13 to SW1-16 of the first stage are connected directly to the output terminal 16.

A D/A converter in accordance with the present invention may comprise a voltage selector 14 which uses three or more stages of switches. That is, the switches of the first stage or the second stage may be connected directly to the output terminal 16 in accordance with the lengths of the lines, and the number of the switches of the first stage connected to the switches of the second stage may be altered. A reduction in the number of switches provided in a path whose parasitic element has a large value (long line length) decreases the drain capacitance with the output terminal taken as a reference, thus reducing a difference in response time between the individual paths.

Figure 7:
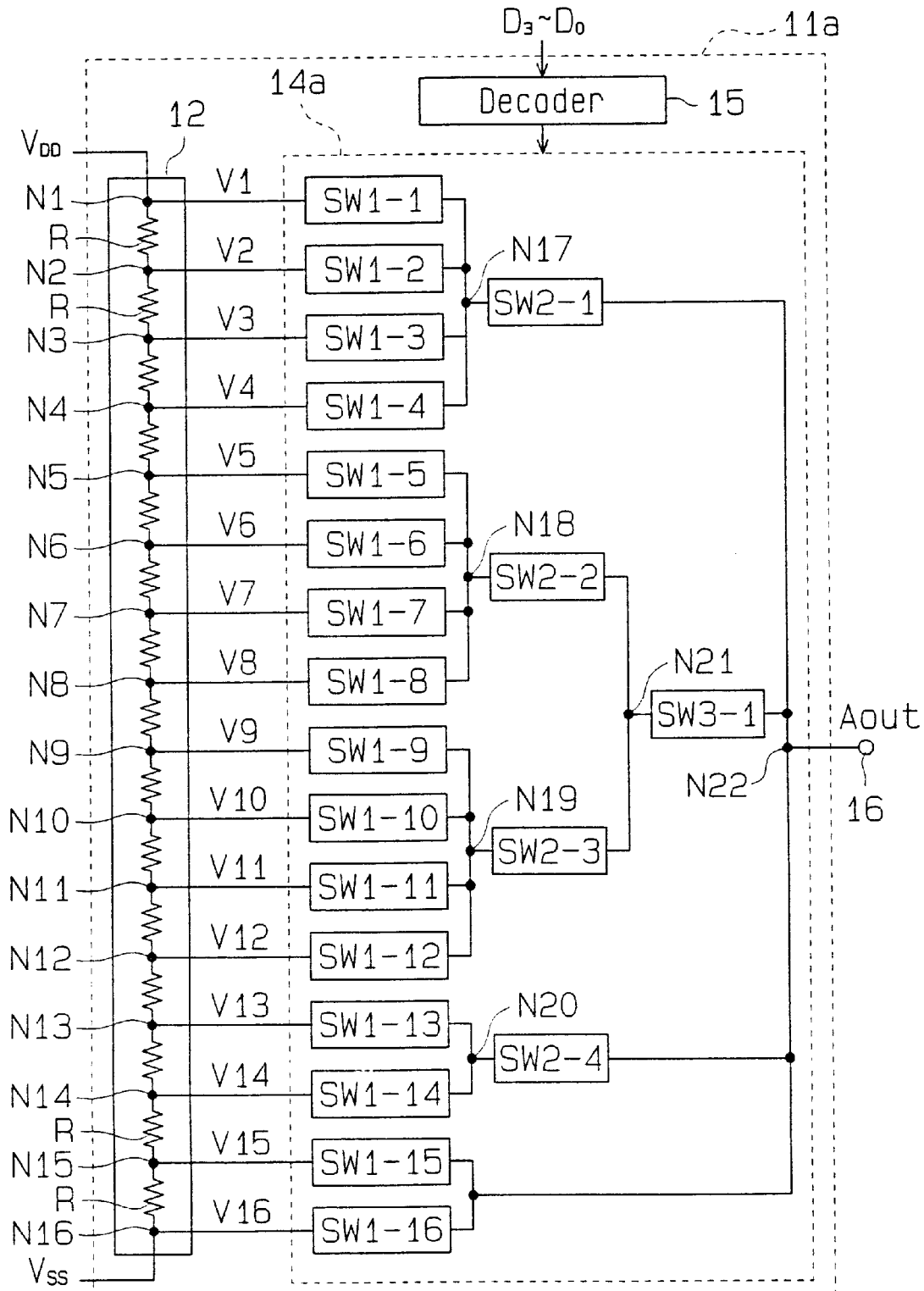
FIG. 7 is a schematic block circuit diagram of a D/A converter according to a fifth embodiment of the invention.

As shown in FIG. 7, for example, a voltage selector 14a of a D/A converter 11a includes a third stage switch SW3-1. The switch SW3-1 is connected to the second stage switches SW2-2 and SW2-3. Four switches SW1-1 to SW1-4 of the first stage are connected to the switch SW2-1 of the second stage which is connected directly to the output terminal 16. Two switches SW1-13 and SW1-14 of the first stage are connected to the switch SW2-4 of the second stage which is connected directly to the output terminal 16. Further, the switches SW1-15 and SW1-16 of the first stage are connected directly to the output terminal 16. Therefore, the lines between the nodes N5–N12 and the output terminal 16 are the longest, while the lines between the nodes N15 and N16 and the output terminal 16 are the shortest.

Figure 8:
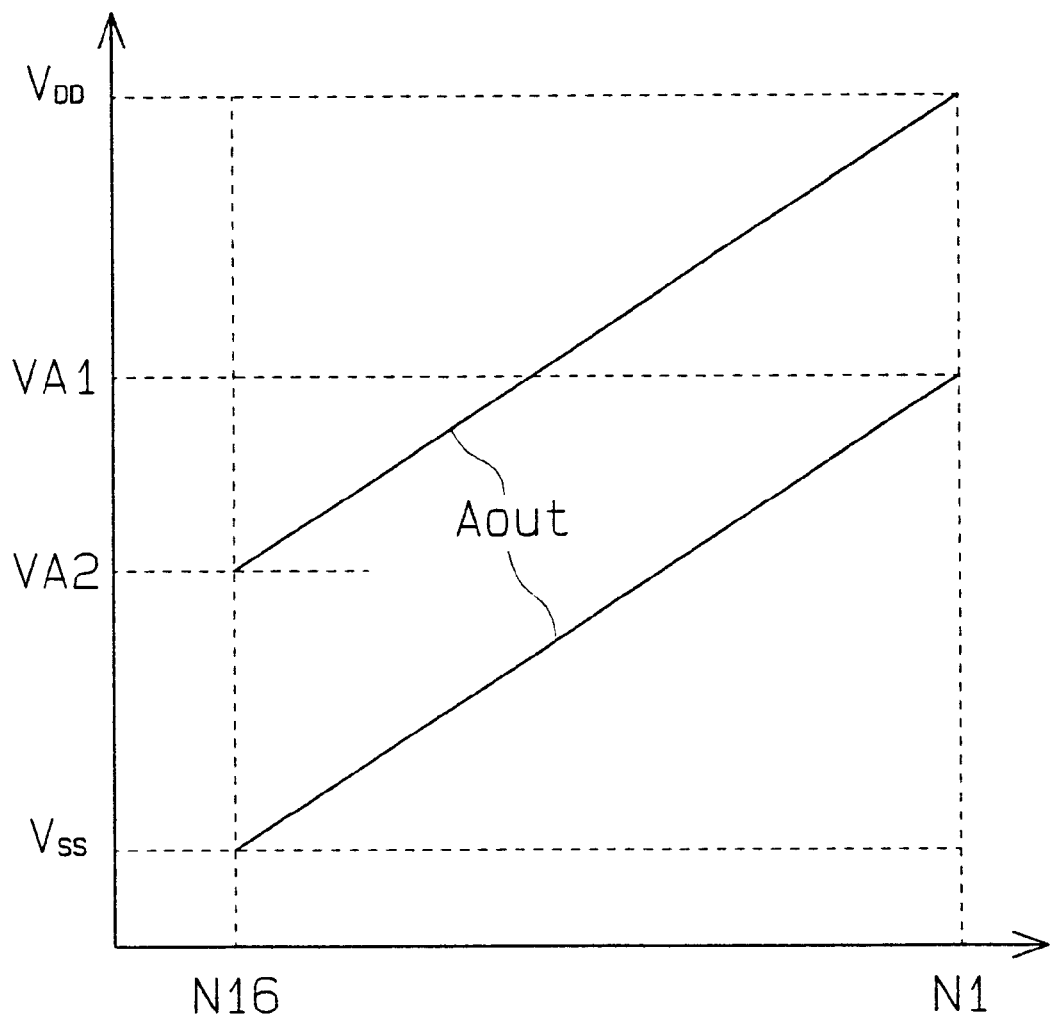
FIG. 8 is a graph showing the relationship between a supply voltage supplied to the D/A converter and a voltage which is generated by the D/A converter.

The voltage supplied to the voltage generator 12 may also be changed. As shown in FIG. 8, for example, the analog signal Aout having a voltage ranging from the voltage of the low-potential voltage supply $V_{SS}$ to the voltage of a first reference voltage supply VA1 with respect to the range of the value of the digital signals D3–D0 from all "0" to all "1" may be output. That is, the voltage generator 12 divides the voltage difference between the voltages of the first reference voltage supply VA1 and the low-potential voltage supply $V_{SS}$ to generate the voltages V1–V16. The decoder 15 receives power from the high-potential voltage supply $V_{DD}$ and the low-potential voltage supply $V_{SS}$, and decodes the digital signals D3–D0 to output a control signal having an H level (the voltage of the high-potential voltage supply $V_{DD}$) or an L level (the voltage of the low-potential voltage supply $V_{SS}$).

Figure 9A:
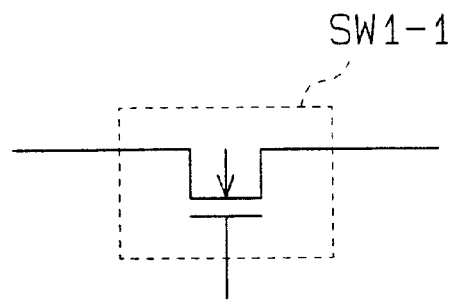
FIGS. 9(a) through 9(c) are circuit diagrams of switches in accordance with the present invention.

When the voltage of the first reference voltage supply VA1 is equal to or lower than the threshold voltage of an N channel MOS (NMOS) transistor, the output signal having a voltage between the voltages of the first reference voltage supply VA1 and the low-potential voltage supply $V_{SS}$ is acquired by using the switch SW1-1 that comprises only of an NMOS transistor, as shown in FIG. 9(a). Further, the need for an inverter circuit for inverting the control signal is eliminated. This reduces the occupying area of the voltage selector 14.

Figure 9B:
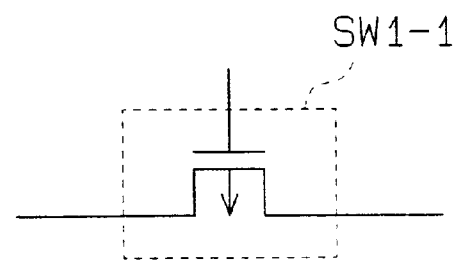
Figure 9C:
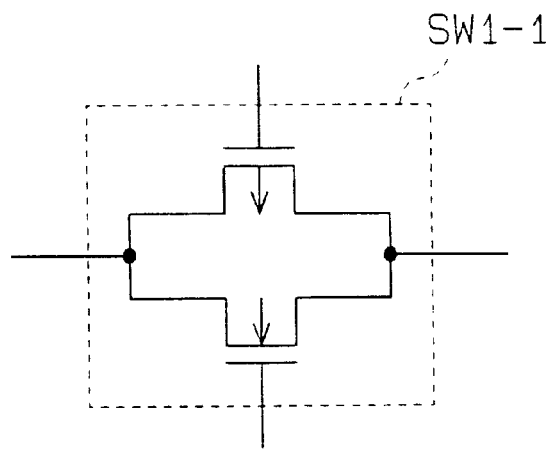

The switches SW1-1 to SW1-16 and SW2-1 to SW2-5 suitable for use in the present invention are transfer gates each comprised of a pair of a P channel MOS (PMOS) transistor and an N channel MOS (NMOS) transistor connected in parallel, as shown in FIG. 9(c). In this case, the control signal is input to the gate of the NMOS transistor and the control signal, after inversion by an inverter circuit (not shown), is input to the gate of the PMOS transistor. Alternatively, the control signal may be input to the gate of the PMOS transistor and the inverted control signal may be input to the gate of the NMOS transistor. As apparent from the above, the use of the transfer gate provides an output signal having the voltage of the high-potential voltage supply but requires an inverter circuit.

The voltage generator 12 may be designed to generate the voltages V1–V16 within the voltage range from the voltage of the high-potential voltage supply $V_{DD}$ to the voltage of a second reference voltage supply VA2. When the voltage of the second reference voltage supply VA2 is equal to or higher than the threshold voltage of a PMOS transistor, the output signal having a voltage between the voltages of the second reference voltage supply VA2 and the high-potential voltage supply $V_{DD}$ is acquired by using the switch SW1-1 that comprises only a PMOS transistor, as shown in FIG. 9(b).

Further, PMOS transistors may be used for the switches SW1-1 to SW1-8 and SW2-1 to SW2-3 which receive voltages close to the voltage of the high-potential voltage supply $V_{DD}$ (e.g., the voltages V1–V8) and NMOS transistors may be used for the switches SW1-9 to SW1-16, SW2-4 and SW2-5 which receive voltages close to the voltage of the low-potential voltage supply $V_{SS}$ (e.g., the voltages V9–V16).

Figure 10:
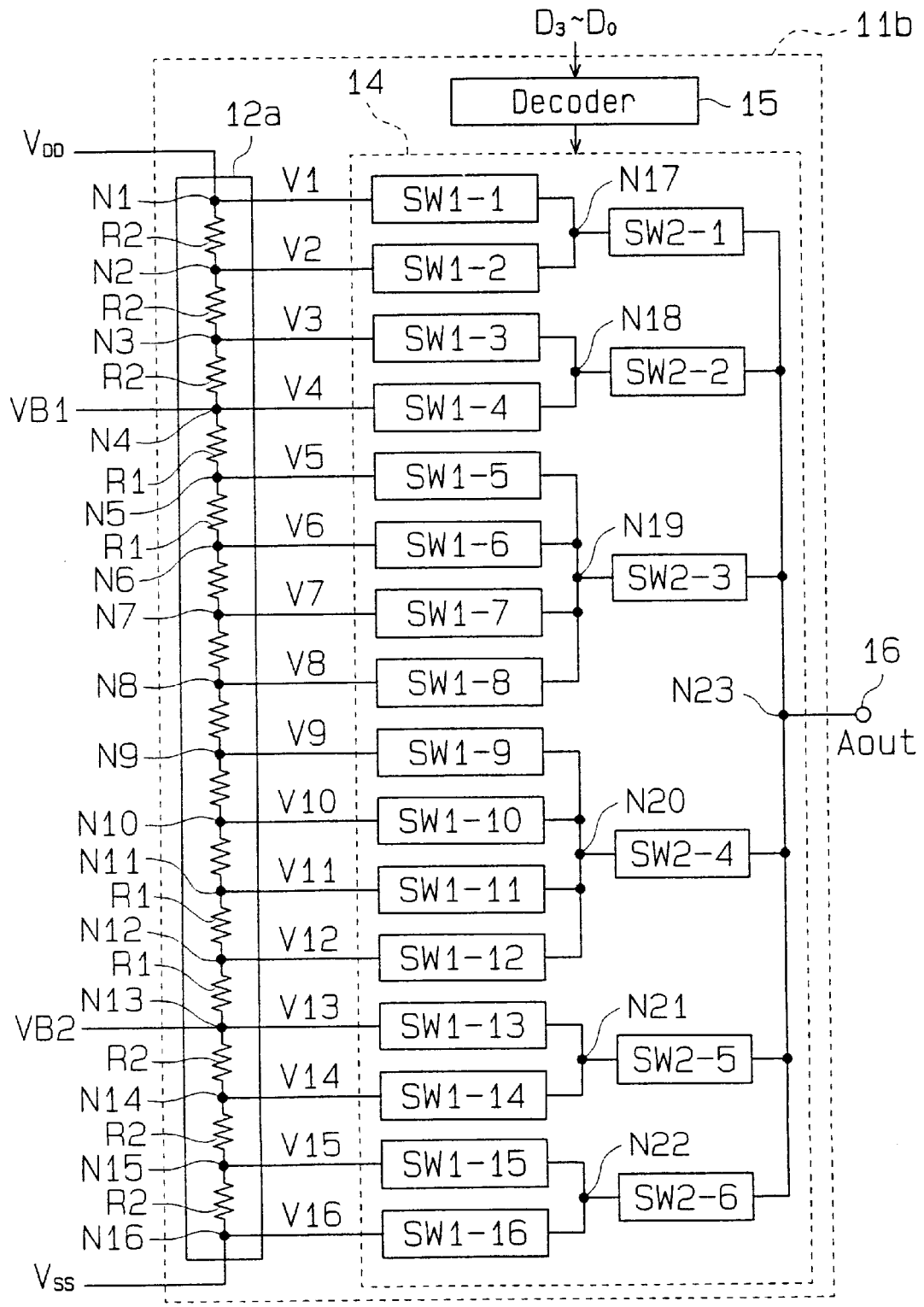
FIG. 10 is a schematic block circuit diagram of a D/A converter according to a sixth embodiment of the present invention.
Figure 11:
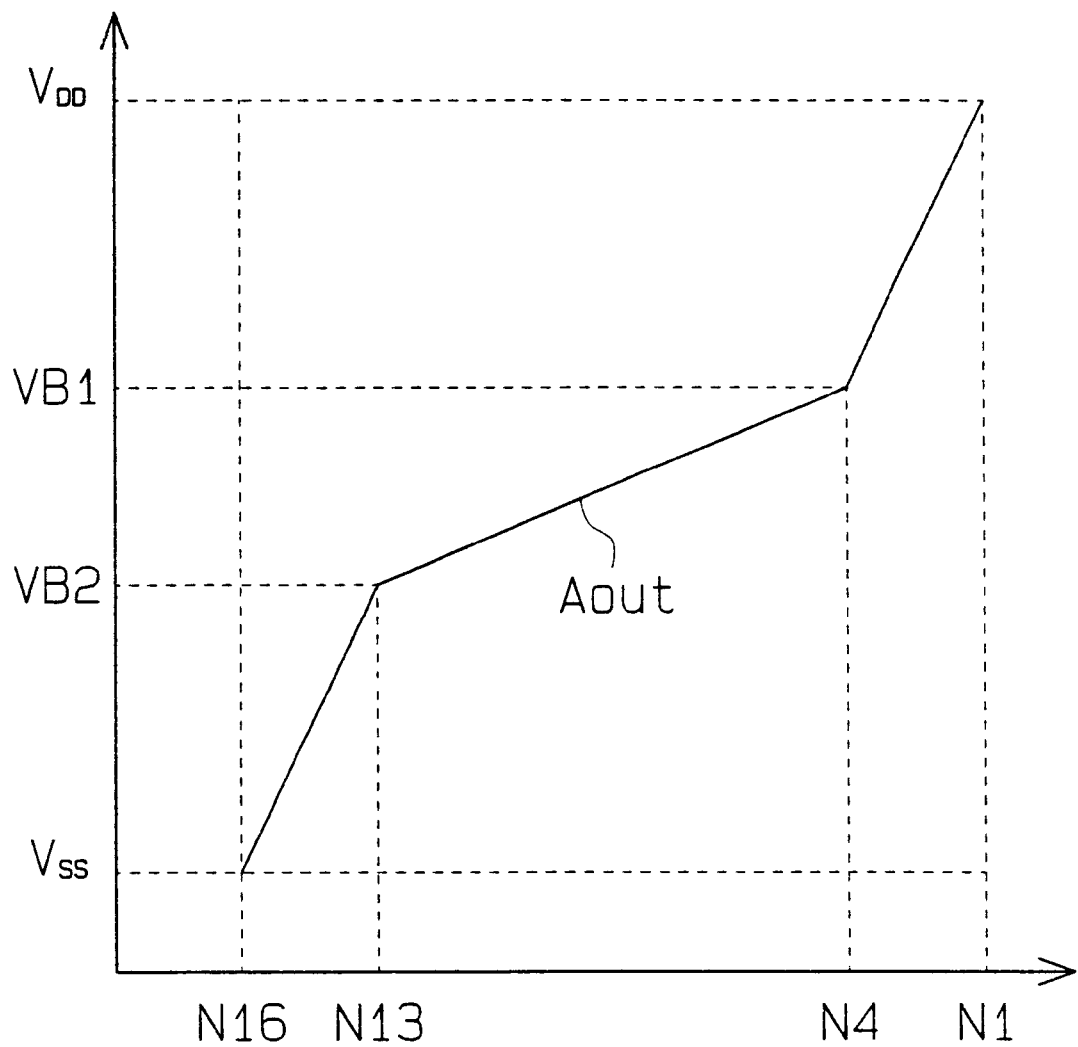
FIG. 11 is a graph showing the relationship between a supply voltage supplied to the D/A converter through compensation and a voltage generated by the D/A converter.

The present invention may be adapted to reduce a variation in output response time that originates from the resistance of the ladder resistor of the voltage generator 12. When the D/A converter 11 is used in an LCD driving circuit, for example, the resistance of the ladder resistor is set in accordance with gamma compensation for the analog signal Aout. Specifically, the resistance of the ladder resistor and the voltage of the reference voltage supply are set such that the analog signal Aout changes more than the digital signal in the vicinity of the maximum value and minimum value of the analog signal Aout, and changes less in the vicinity of the intermediate value (VB1–VB2), as shown in FIG. 11. In a voltage generator 12a in a D/A converter 11b, exemplified in FIG. 10, the resistance of the resistor R2 between the nodes N1–N4 (3×R2) and the resistance of a resistor R2 between the nodes N13–N16 (3×R2) are set greater than the resistance of the resistor R1 between the nodes N4–N13 (9×R1).

According to present invention, one switch SW2-1 or SW2-2 of the second stage is connected to each of two pairs of switches SW1-1 and SW1-2 and SW1-3 and SW1-4 of the first stage between the nodes N1–N4 and the output terminal 16, and one switch SW2-5 or SW2-6 of the second stage is connected to each of two pairs of switches SW1-13 and SW1-14 and SW1-15 and SW1-16 of the first stage between the nodes N13–N16 and the output terminal 16. This structure reduces the drain capacitance with the output terminal 16 taken as a reference, thus preventing the output time from becoming longer due to an otherwise increased resistance. That is, the difference between the output time for the analog signal Aout having any one of the voltages V2, V3, V14 and V15 respectively at the nodes N2, N3, N14 and N15 and the output time for the analog signal Aout having the voltage at any other node becomes smaller to quicken the output response time of the D/A converter.

Therefore, the present examples and embodiments are to be considered as illustrative and not restrictive and the invention is not to be limited to the details given herein, but may be modified within the scope and equivalence of the appended claims.

What is claimed is:

1. A voltage selector comprising:
   a plurality of first stage transfer gates including first and second groups of transfer gates, the first group of transfer gates being provided on a first signal transfer path and the second group of transfer gates being provided on a second signal transfer path, one of said first stage transfer gates transferring an input signal in response to a first select signal; and
   a plurality of second stage transfer gates including a first transfer gate connected to said first group of transfer gates on the first signal transfer path and a second transfer gate connected to said second group of transfer gates on the second signal transfer path, one of said second stage transfer gates receiving and transferring an input signal, transferred from an associated one of said first stage transfer gates, in response to a second select signal,
   the number of said second group of transfer gates on the second signal transfer path being smaller than the number of the first group of transfer gates on the first signal transfer path, and the number of the second group of transfer gates being set such that a load of the second transfer gate being smaller than a load of the first transfer gate.

2. The voltage selector according to claim 1, wherein each of the first and second stage transfer gates includes an N channel MOS transistor, and the input signal has a voltage equal to or lower than a threshold voltage of the N channel MOS transistor.

3. The voltage selector according to claim 1, wherein each of the first and second stage transfer gates includes a P channel MOS transistor, and the input signal has a voltage equal to or higher than a threshold voltage of the P channel MOS transistor.

4. A D/A converter comprising:
   a voltage generator for dividing a voltage of a reference voltage supply and generating a plurality of divided voltages;
   a decoder for decoding a digital signal and generating first and second select signals:
   a plurality of first stage transfer gates provided in accordance with the plurality of divided voltages and including first and second groups of transfer gates, the first group of transfer gates being provided on a first signal transfer path and the second group of transfer gates being provided on a second signal transfer path, one of the first stage transfer gates receiving an associated divided voltage from the voltage generator and outputting the divided voltage in response to the first select signal; and a plurality of second stage transfer gates including a first transfer gate connected to the first group of transfer gates on the first signal transfer path and a second transfer gate connected to the second group of transfer gates on the second signal transfer path, one of the second stage transfer gates receiving and outputting the divided voltage, transferred from an associated one of the first stage transfer gates, in response to the second select signal, the number of the second group of transfer gates on the second signal transfer pith being smaller than the number of the first group of transfer gates on the first signal transfer path, and the number of the second group of transfer gates being set such that a load of the second transfer gate being smaller than a load of the first transfer gate.

5. The D/A converter according to claim 4, wherein each of the first and second stage transfer gates includes an N channel MOS transistor, and the divided voltages have voltages equal to or lower than a threshold voltage of the N channel MOS transistor.

6. The D/A converter according to claim 4, wherein each of the first and second stage transfer gates includes a P channel MOS transistor, and the divided voltages have voltages equal to or higher than a threshold voltage of the P channel MOS transistor.

* * * * *